United States Patent [19]
Ehrhardt

[11] Patent Number: 6,052,569
[45] Date of Patent: Apr. 18, 2000

[54] RADIO RECEIVER HAVING A FIRST TUNER CIRCUIT FOR RECEIVING SIGNALS IN A FIRST AND A SECOND FREQUENCY RANGE, AND A SECOND TUNER CIRCUIT FOR RECEIVING SIGNALS IN THE FIRST AND A THIRD FREQUENCY RANGE

[75] Inventor: Friedhelm Ehrhardt, Alsfeld, Germany

[73] Assignee: U.S. Philips Corporation, New York, N.Y.

[21] Appl. No.: 09/004,249

[22] Filed: Jan. 8, 1998

[30] Foreign Application Priority Data

Jan. 17, 1997 [DE] Germany ............................ 197 01 459

[51] Int. Cl.[7] ........................................................ H04B 1/16
[52] U.S. Cl. ..................................... 455/188.1; 455/189.1; 455/190.1; 455/191.1
[58] Field of Search .............................. 455/188.1, 189.1, 455/150.1, 154.1, 335, 340, 191.1, 190.1, 187.1

[56] References Cited

U.S. PATENT DOCUMENTS

| | | | |
|---|---|---|---|
| 5,068,918 | 11/1991 | Verheijen et al. ................... | 455/188.1 |
| 5,280,636 | 1/1994 | Kelley et al. ......................... | 455/190.1 |
| 5,574,997 | 11/1996 | Hong ..................................... | 455/190.1 |
| 5,752,175 | 5/1998 | Roullet et al. ....................... | 455/190.1 |
| 5,768,685 | 6/1998 | Patel et al. ........................... | 455/190.1 |
| 5,835,853 | 11/1998 | Enoki et al. ......................... | 455/189.1 |

*Primary Examiner*—Daniel S. Hunter
*Assistant Examiner*—Thuan T. Nguyen
*Attorney, Agent, or Firm*—Edward W. Goodman

[57] ABSTRACT

A radio receiver includes a first tuner circuit (1) for receiving radio signals of a first and a second frequency range, and a second tuner circuit (2) for receiving radio signals of a third frequency range. The second tuner circuit (2) is also used for receiving the first frequency range and works independently of the first tuner circuit (1), in that the second tuner circuit (2) includes a first mixer circuit (35, 36, 37) which converts the radio signals of the third frequency range to the second frequency range, and a first integrated circuit element (5) which alternatively converts radio signals of the first frequency range to a first intermediate frequency, or the radio signals of the third frequency range converted to the second frequency range by the first mixer circuit (35, 36, 37) to a second intermediate frequency. The second tuner circuit (2) may derive coded information, more particularly, traffic information from the radio signals of the first frequency range.

9 Claims, 2 Drawing Sheets

RADIO RECEIVER HAVING A FIRST TUNER CIRCUIT FOR RECEIVING SIGNALS IN A FIRST AND A SECOND FREQUENCY RANGE, AND A SECOND TUNER CIRCUIT FOR RECEIVING SIGNALS IN THE FIRST AND A THIRD FREQUENCY RANGE

BACKGROUND OF THE INVENTION

1. Field of the Invention

The invention relates to a radio receiver comprising a first tuner circuit for receiving radio signals of a first and a second frequency range, and comprising a second tuner circuit for receiving radio signals of a third frequency range.

Such a radio receiver is used, for example, in the car radios of the General Motors Oldsmobile series.

2. Description of the Related Art

The first tuner circuit of this known radio receiver is used for receiving frequency-modulated signals of the FM band, and for receiving amplitude-modulated signals of the AM band. For receiving the US weather band, which broadcasts weather reports in frequency-modulated form in a frequency range from 162.4 MHz to 162.55 MHz, there is provided a separately arranged receiver that is completely independent of the first tuner circuit.

SUMMARY OF THE INVENTION

It is an object of the invention to provide a radio receiver of the type defined in the opening paragraph which is simple and cost effective and makes possible the evaluation of traffic information and additional data from various stations of the first frequency range without interrupting the reproduction of a selected station.

According to the invention this object is achieved in that the second tuner circuit is used for receiving both the first and the third frequency range, and works independently ol the first tuner circuit, that the second tuner circuit comprises a first mixer circuit which converts the radio signals of the third frequency range to the second frequency range, in that the second tuner circuit comprises a first integrated circuit element which alternatively converts the radio signals of the first frequency range to a first intermediate frequency, or the radio signals of the third frequency range converted to the second frequency range by the first mixer circuit to a second intermediate frequency, and in that the second tuner circuit derives coded information, more particularly, traffic information from the radio signals of the first frequency range.

The first integrated circuit element has a first input for signals of the first frequency range and a second input for signals of the second frequency range. The first integrated circuit element mixes the signals of the first frequency range down to the first intermediate frequency, and the signals of the second frequency range applied to the second signal input down to the second intermediate frequency. The second input of the first integrated circuit element is preceded by a first mixer circuit which mixes the radio signals of the third frequency range down to the second frequency range for which the second signal input of the first integrated circuit element is intended. The radio signals of the third frequency range, converted to the second frequency range by the first mixer circuit, may then be converted to the second intermediate frequency by the first integrated circuit element. This renders the second tuner circuit suitable for receiving both the first and third frequency ranges.

The second tuner circuit may also include a decoder for deriving coded information, more particularly, traffic information from the radio signals of the first frequency range. The second tuner circuit operates completely independently of the first tuner circuit, that is to say, a user of the radio receiver can listen to a specific radio program of, for example, the first frequency range by the first tuner circuit, while the second tuner circuit simultaneously derives and evaluates traffic announcements and other information from the radio signals coming from various stations in the first frequency range. This enables the radio receiver to render also traffic announcements available that are not broadcast by the station selected by the person listening to the radio.

The mixer circuit upstream of the second input of the first integrated circuit element can be manufactured in a very simple and cost effective manner. No separate receiver for a third frequency range needs to be used. The components already available in the first integrated circuit element, more particularly, filter, mixer and local oscillator may instead be used for the reception of the third frequency range. As a result, the radio receiver becomes highly cost effective.

In an advantageous embodiment of the invention, the radio signals of the first frequency range are frequency-modulated signals of the FM band, the radio signals of the second frequency range are amplitude-modulated AM band signals, and the radio signals of the third frequency range are frequency-modulated US weather band signals.

A further advantageous embodiment of the invention is characterized in that the second tuner circuit comprises a second integrated circuit element, this second integrated circuit element alternatively converting to the second intermediate frequency, the radio signals of the first frequency range converted to the first intermediate frequency, or to a third intermediate frequency, the radio signals of the second frequency range converted to the second intermediate frequency.

The common utilization of the second intermediate frequency both for the radio signals of the first frequency range and for the radio signals of the second or third frequency range, respectively, makes it possible to utilize the filter modules of the second intermediate frequency in common. This again saves on components and thus cost.

In the FM range of the second tuner circuit, the FM band signals in the first integrated circuit element are mixed down to the first intermediate frequency of, for example, 72.2 MHz. Subsequently, these FM signals are converted to the second intermediate frequency of, for example, 10.7 MHz by the second integrated circuit element. Then the signals are demodulated or decoded, respectively.

When the second tuner circuit operates in the weather band, the US weather band signals of the third frequency range, mixed to the AM band, are converted to the second intermediate frequency of 10.7 MHz. Subsequently, the signals are demodulated and processed as audio signals.

A further advantageous embodiment of the invention is characterized in that the first tuner circuit comprises a third integrated circuit element by means of which the radio signals of the first frequency range may alternatively be converted to the first intermediate frequency or the radio signals of the second frequency range to the second intermediate frequency, in that the first tuner circuit comprises a fourth integrated circuit element which may alternatively convert, to the second intermediate frequency, the radio signals of the first frequency range converted to the first intermediate frequency, or, to the third intermediate frequency, the radio signals of the second frequency range converted to the second intermediate frequency, and in that the first and third, as well as the second and fourth, integrated circuit elements have identical structures.

The use of identical integrated circuit elements for the first and second tuner circuits provides a lower number of different pieces. This leads to a saving of cost.

A further advantageous embodiment of the invention is characterized in that the first integrated circuit element comprises an oscillator circuit housing an oscillator frequency which is an integer multiple of a predefinable reference frequency, and in that the oscillator circuit is coupled to the first mixer circuit and, via a divider, to an internal mixer circuit of the first integrated circuit element, this internal being mixer circuit used for mixing the signals of the second frequency range to the second intermediate frequency.

The oscillator circuit of the first integrated circuit element is used both for producing the local oscillator signal of the first mixer circuit, which is arranged outside the first integrated circuit element, and for producing the local oscillator signal of the internal mixer circuit of the first integrated circuit element for mixing the radio signals of the second frequency range to the second intermediate frequency.

The common utilization of the oscillator circuit of the first integrated circuit element provides a saving on additional components and thus cost.

A further advantageous embodiment of the invention is characterized in that the first intermediate frequency is 72.2 MHz and the second intermediate frequency is 10.7 MHz.

These intermediate frequencies have proven to be extremely advantageous in practice.

The radio receiver may preferably be used in an audio set or in a car radio, respectively.

These and other aspects of the invention will be apparent from and elucidated with reference to the embodiments described hereinafter.

DESCRIPTION OF THE PREFERRED EMBODIMENTS

Figure 1A:
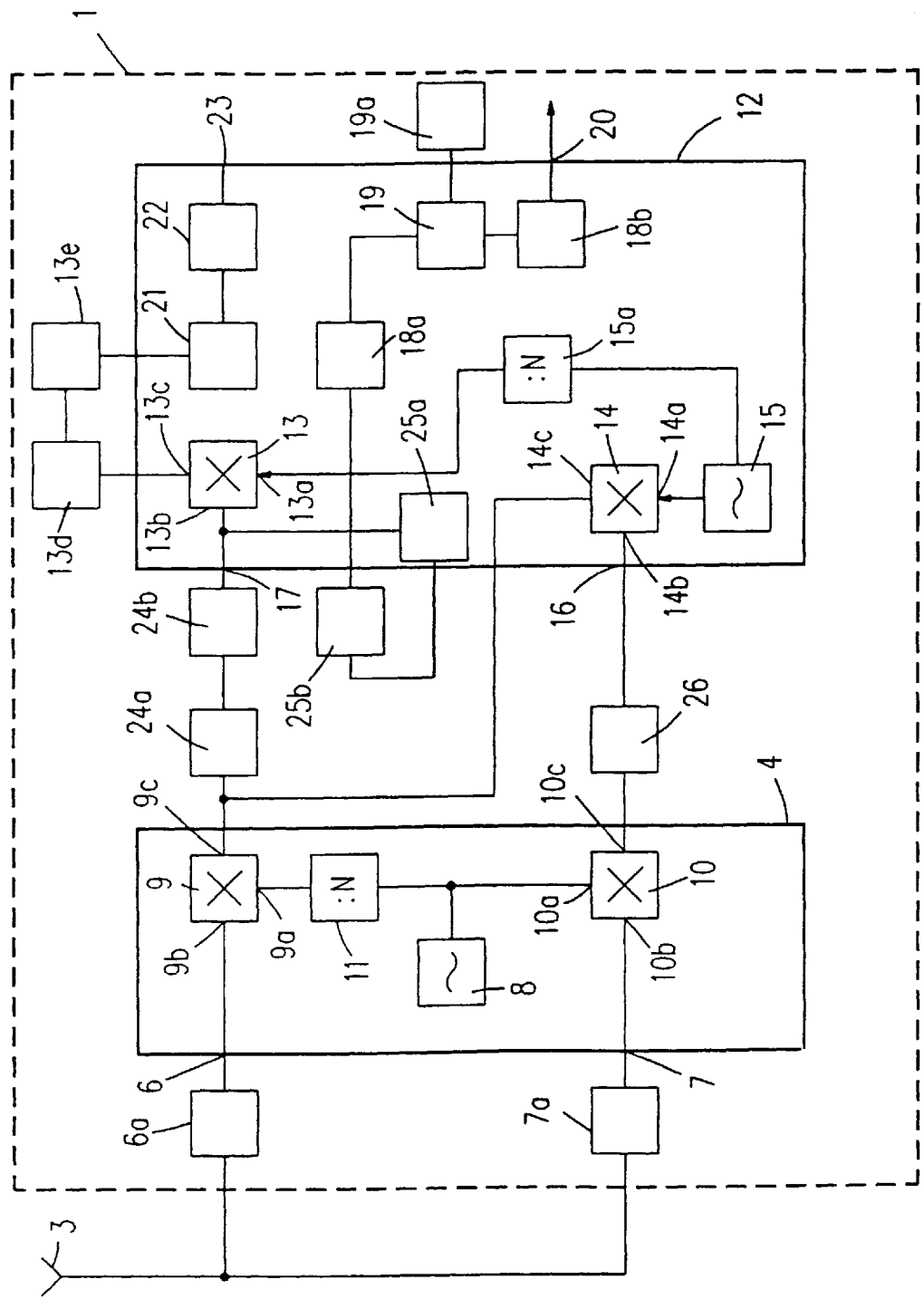
FIG. 1a shows part of a radio receiver in which the part shown is used for receiving AM and FM-band signals.
Figure 1B:
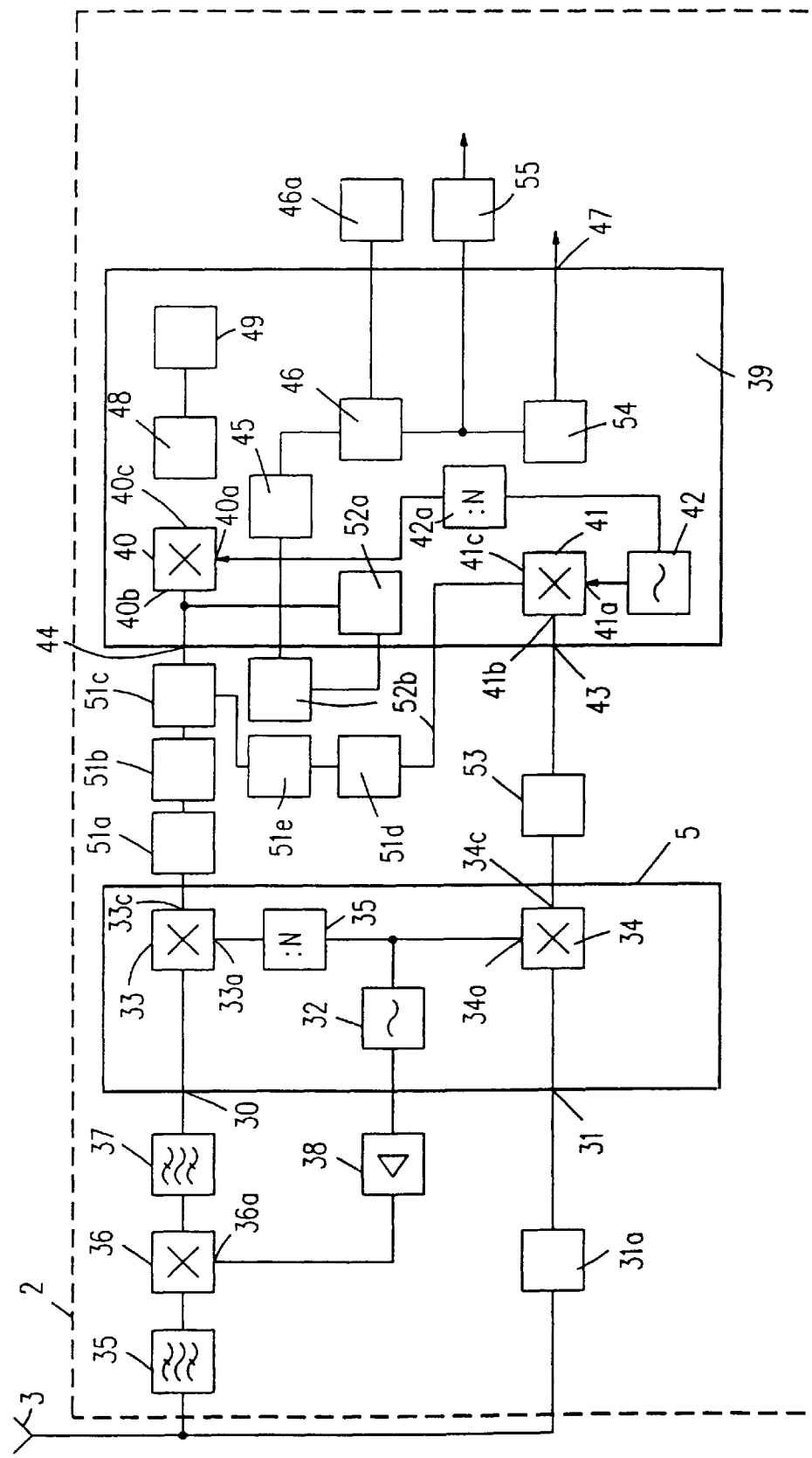
FIG. 1b shows part of the radio receiver in which the part shown is used for receiving signals of the US weather band, and for evaluating coded information, more particularly, traffic information of the FM band.

The FIGS. 1a and 1b give a diagrammatic representation of a block circuit diagram of a radio receiver in which FIG. 1a shows a first tuner circuit 1 of the radio receiver for receiving radio signals of a first and a second frequency range, and FIG. 1b shows a second tuner circuit 2 of the radio receiver for receiving radio signals of the first and a third frequency range. The first frequency range is the frequency-modulated FM band, the second frequency range is the amplitude-modulated AM band, and the third frequency range is the US weather band. The US weather band transmits frequency-modulated weather information in a frequency band from 162.4 to 162.55 MHz. The radio signals are applied to the first tuner circuit 1 and the second tuner circuit 2 from an antenna 3. The first tuner circuit 1, shown in FIG. 1a, comprises an integrated circuit element 4, and the second tuner circuit, shown in FIG. 1b, an integrated circuit element 5, the integrated circuit element 4 and the integrated circuit element 5 having an identical structure. Hereinbelow, the structure of the first tuner circuit 1, shown in FIG. 1a, will be explained. The integrated circuit element 4 has an AM input 6 for signals of the AM band, a tunable local oscillator 8, an FM input 7 for signals of the FM band, a first mixer 9 and a second mixer 10. The tunable local oscillator 8 is coupled, via a divider 11, to the local oscillator input 9a of the first mixer 9, and directly to the local oscillator input 10a of the second mixer 10. The mixer inputs 9b, 10b respectively, of the first mixer 9 and second mixer 10 are coupled to the AM input 6 and FM input 7, respectively, of the integrated circuit element 4. The first tuner circuit 1 further comprises an integrated circuit element 12. The integrated circuit element 12 includes a third mixer 13 which has a local oscillator input 13a, a mixer input 13b and an intermediate frequency output 13c. The integrated circuit element 12 also includes a fourth mixer 14 which has a local oscillator input 14a, a mixer input 14b and an intermediate frequency output 14c. A second local oscillator 15, having a fixed frequency of 61.5 MHz, is provided which activates the local oscillator input 13a of the third mixer 13, via a divider 15a, and directly activates the local oscillator input 14a of the fourth mixer 14. The mixer input 14b of the fourth mixer 14 is coupled to a first intermediate frequency input 16 which is arranged for a first intermediate frequency of 72.2 MHz. The mixer input 13b of the third mixer 13 is coupled to a second intermediate frequency input 17 which is arranged for a second intermediate frequency of 10.7 MHz. The second intermediate frequency input 17 is coupled to a first FM output 20 via a series combination of a first FM amplifier 25a, an external intermediate frequency stage 25b, a second FM amplifier 18a, a first FM demodulator 19, which is coupled to an external resonance circuit 19a, and a third FM amplifier 18b. The intermediate frequency output 13c of the third mixer 13 is coupled to a first AM output 23 via an outcoupling circuit 13d, to a subsequent selection circuit 13e, and then via a series combination of a first AM amplifier 21 and a first AM demodulator 22. The intermediate frequency output 9c of the first mixer 9 is coupled to the second intermediate frequency input 17 of the integrated circuit element 12 via a series combination of a first repeating coil 24a and a first filter circuit 24b. The first repeating coil 24a is used as the power supply of the first mixer 9 and at the same time, for filtering and adapting to the next first filter circuit 24b. The first filter circuit 24b is arranged as a bandpass filter for the second intermediate frequency of 10.7 MHz. The intermediate frequency output 9c of the first mixer 9 is furthermore coupled to the mixer output 14c of the fourth mixer 14. The intermediate frequency output 10c of the second mixer 10 is coupled to the mixer input 14b of the fourth mixer 14 via a second filter circuit 26.

The first tuner circuit 1 may be switched either to the AM or FM mode. If the first tuner circuit 1 is switched to the AM mode, the antenna 3 applies an AM signal to the AM input 6 of the integrated circuit element 4 via a preliminary input stage 6a. This AM signal is then mixed to the second intermediate frequency of 10.7 MHz by the first mixer 9 whose local oscillator input 9a receives the local oscillator signal from the first local oscillator 8 through the divider 11. This intermediate frequency signal of 10.7 MHz is led through the first repeating coil 24a and filtered in the subsequent first filter circuit 24b which operates as a bandpass filter for the 10.7 MHz center frequency. The filtered AM signal having the second intermediate frequency of 10.7 MHz is then applied to the mixer input 13b of the third mixer 13 and mixed down to a third intermediate frequency of 450 kHz. To that end, the local oscillator input 13a of the third mixer circuit 13 receives a local oscillator signal having the 10.25 MHz frequency from the second local oscillator 15 via the divider 15a. Subsequently, the signal mixed down to the third intermediate frequency of 450 kHz is applied to the first AM amplifier 21, via the outcoupling circuit 13d and the subsequent selection circuit 13e, amplified and then demodulated by the first AM demodulator 22. The demodulated AM signal is then available in the first AM output 23.

If the first tuner circuit 1 is switched to the FM mode, the FM input 7 of the integrated circuit element 4 is supplied with the frequency-modulated FM signal via a preliminary input stage 7a of the antenna 3. The frequency-modulated FM signal is then mixed down by the second mixer 10 to the first intermediate frequency of 72.2 MHz. To that end, the local oscillator input 10a of the second mixer 10 receives its signal directly from the first local oscillator 8. The frequency-modulated FM signal mixed down to the first intermediate frequency of 72.2 MHz is then filtered in the second filter circuit 26, which is arranged as a bandpass filter for which the first intermediate frequency of 72.2 MHz is provided, and is afterwards applied to the first intermediate frequency input 16 of the integrated circuit element 12, and to the mixer input 14b of the fourth mixer 14. In the FM mode, the fourth mixer 14 receives a local oscillator signal having the frequency 61.5 MHz directly from the second local oscillator 15. On the intermediate frequency output 14c of the fourth mixer 14 a frequency-modulated signal having the second intermediate frequency of 10.7 MHz is then available, which is then filtered by the first repeating coil 24a and the first filter circuit 24b. The first filter circuit 24b and the first repeating coil 24a are used both in the AM mode and in the FM mode, so that a saving is effected on components and cost for the expensive filter elements. The preliminary filtered signal is then amplified in the first FM amplifier 25a, subsequently applied to the external IF stage 25b and the second FM amplifier 18a and demodulated in the first FM demodulator 19. Then the signal is amplified in the third FM amplifier 18b. The demodulated signal is then available on the first FM output 20.

The second integrated circuit element 5 of the second tuner circuit 2, shown in FIG. 1b, has an AM input 30, an FM input 31, a third local oscillator 32, a fifth mixer 33 and a sixth mixer 34. The third local oscillator 32 applies a local oscillator signal directly to the local oscillator input 34a of the sixth mixer and, via a divider 35, a local oscillator signal to the local oscillator input 33a of the fifth mixer 33. The AM input 30 of the integrated circuit element 5 is coupled to the antenna 3 via a series combination of a first bandpass filter 35, a seventh mixer 36 and a second bandpass filter 37. The third local oscillator 32 of the integrated circuit element 5 is coupled to the local oscillator input 36a of the seventh mixer 36 via a buffer 38. The first bandpass filter 35 has a very small bandwidth for the frequency range of the US weather band. The second tuner circuit 2 comprises an integrated circuit element 39 which includes an eighth mixer 40, a ninth mixer 41 and a fourth local oscillator 42. The integrated circuit element 39 has a similar structure to the integrated circuit element 12 shown in FIG. 1a. The local oscillator 42 produces a constant signal having the frequency of 61.5 MHz. The fourth local oscillator 42 is coupled directly to the local oscillator input 41a of the ninth mixer 41 and, via a divider 42a, to the local oscillator input 40a of the eigthth mixer 40. The mixer input 40b of the eighth mixer 40 is coupled to a second IF input 44, and the mixer input 41b of the ninth mixer 41 is coupled to a first IF input 43. The second IF input 44 is coupled to a series combination of a fourth FM amplifier 52a, an external IF stage 52b, a fifth FM amplifier 45, and a second FM demodulator 46 which is coupled to an external oscillation circuit 46a. The output of the demodulator 46 is also coupled both to a sixth FM amplifier 54 and also to an external decoder 55.

The intermediate frequency output 33c of the fifth mixer 33 is connected to the second IF input 44 of the integrated circuit element 39 via a series combination of a second repeating coil 51a, a third filter circuit 51b and a coupling stage 51c. The second repeating coil 51a is used for supplying power to the fifth mixer 33 and, at the same time, for adapting to the subsequent third filter circuit 51b. The intermediate frequency output 34c of the sixth mixer 34 is coupled to the first IF input 43 of the integrated circuit element 39 via a fourth filter circuit 53. The intermediate frequency output 41c of the ninth mixer 41 is connected to the coupling stage 51c via a series combination of a third repeating coil 51d and a fifth filter circuit 51e. The third repeating coil 51d is used for supplying power to the ninth mixer 41 and, at the same time, for adapting to the subsequent fifth filter circuit 51e.

The fifth filter circuit 51e is arranged for selecting the FM band and the third filter circuit 51b for selecting the weather band. The bandwidth of the third filter circuit 51b is, therefore, distinctly narrower than that of the fifth filter circuit 51e.

The second tuner circuit 2 operates independently of the first tuner circuit 1. The second tuner circuit 2 may be used, alternatively, for receiving the US weather band or for receiving signals of the FM band. If the second tuner circuit is used for receiving the US weather band, the US weather band is filtered out of the received signals coming from the antenna 3 by means of the first bandpass filter 35. The signals of the US weather band are transmitted in a frequency range between 162.4 MHz and 162.55 MHz. The weather information is frequency modulated. The signals of the US weather band are then applied to the seventh mixer 36 whose local oscillator input 36a receives the local oscillator signal from the third local oscillator 32 of the integrated circuit element 5 via the buffer 38. The seventh mixer 36 mixes down the signals of the US weather band to the range of the AM band for which the AM input 30 of the integrated circuit element 5 is arranged. The undesired mixing products are extracted by means of the second bandpass filter 37. The US weather band signals mixed in the range of the AM band are then converted to the second intermediate frequency of 10.7 MHz by the fifth mixer 33. The local oscillator signal of the third local oscillator 32 is divided by a divider and applied to the local oscillator input 33a of the fifth mixer 33.

The third local oscillator 32 thus generates both the local oscillator signal for the seventh mixer 36 and the local oscillator signal for the fifth mixer 33. The US weather band signal converted down to the second intermediate frequency of 10.7 MHz is then led, via the second repeating coil 51a, to the third filter circuit 51b which operates as a bandpass filter and is arranged for an intermediate frequency of 10.7 MHz. The filtered signal is subsequently applied to the second IF input 44 of the integrated circuit element 39 via the coupling circuit 51c. Then the signal is amplified in the fourth FM amplifier 52a and applied to the fifth IF amplifier 45 via the external IF stage 52b. Afterwards, the signal is demodulated by the second FM demodulator 46 and amplified in the sixth FM amplifier 54. On the second FM output 47, the demodulated signal of the US weather band is available and this signal may then be applied to further circuits for the audio signal processing.

If the second tuner circuit 2 is switched to the FM mode, the FM signal produced by the antenna 3 is applied to the FM input 31a of the integrated circuit element 5 via a preamplifier 31a. This FM signal is then mixed down to the first intermediate frequency of 72.2 MHz by the sixth mixer 34. The third local oscillator 32 applies directly the local oscillator signal to the local oscillator input 34 of the sixth mixer 34.

The mixing signal, available on the intermediate frequency output 34c of the sixth mixer 34, is then filtered by the fourth filter circuit 53. This fourth filter circuit 53 operates as a bandpass filter whose center frequency lies at 72.2 MHz, that is to say, at the first intermediate frequency. The FM signal, converted down to the 72.2 MHz frequency, is then applied to the first IF input 43 of the integrated circuit element 39 and after that to the ninth mixer 41. The ninth mixer 41 receives, on its local oscillator input 41a, a local oscillator signal having the frequency of 61.5 MHz from the fourth local oscillator 42. As a result, a frequency-modulated signal, having the frequency of 72.2 MHz, is converted down to the second intermediate frequency of 10.7 MHz. This signal, available on the intermediate frequency output 41c of the ninth mixer 41, is then applied to the coupling stage 51c and, afterwards, to the second intermediate frequency input 44 of the integrated circuit element 39 via the third repeating coil 51d in the fifth filter circuit 51e. Subsequently, the signal is amplified by the fourth FM amplifier 52a, applied to the second external IF stage 52b and amplified in the fifth FM amplifier 45. After this, the signal is demodulated by the second FM demodulator 46. This buffered signal is then applied to an external data decoder 55 which decodes the data information contained in the FM signal. In further circuits (not shown), this decoded data information may then be evaluated, processed, used for further functions, and/or displayed to the user. For example, an RDS/TMC decoder decoding RDS/TMC traffic information contained in the FM signal may be used for this purpose.

In the FM mode, the second tuner circuit may sequentially evaluate and process RDS/TMC traffic information and other data information of all the FM stations received by the antenna 3. This may be effected irrespective of which FM station or AM station is set in the first tuner circuit and is being heard by the radio listener at that moment. The FM mode of the second tuner circuit 2 is exclusively used for the evaluation of RDS/TMC traffic information and other information, whereas, the FM mode of the first tuner circuit 1 is used for reproducing an FM station desired by a listening person.

In addition, the radio receiver may be used for receiving the AM band if the first tuner circuit 1 is switched to the AM mode. Additionally, it is possible for the radio receiver to be used for the reproduction of the US weather band when the second tuner circuit 2 is switched to US weather band mode.

The radio receiver may advantageously be manufactured with two identical circuit modules 4 and 12 (FIG. 1a) and S and 39 (FIG. 1b) which are highly integrated. The AM-band input 30 of the integrated circuit element 5 is used for mixing US weather band signals down to the AM band by means of an upstream mixer circuit. The local oscillator signal of the third local oscillator 32 of the integrated circuit element 5 is used for this mixer circuit arranged upstream of the integrated circuit element 5 and formed by the first bandpass filter 35, the seventh mixer 36 and the second bandpass filter 37. As a result, it is possible to omit a separate receiver for the US weather band and, as against a separately manufactured receiver for the US weather band, this provides a distinct saving on cost.

For the integrated circuit element 4 and the integrated circuit element 5, for example, the IC TEA 6811 T manufactured by Philips Electronics may be used.

For the integrated circuit element 12 and the integrated circuit element 39, for example, the IC TEA 6822 T manufactured by Philips Electronics may be used.

Thus, a radio receiver has been provided which can be manufactured in an extremely cost-effective manner by largely using highly integrated standard modules and it having the following essential characteristic features:
reception of the AM band,
reception of the FM band,
reception of the US weather band,
in the AM and FM modes, there is a further FM channel available for continuously evaluating RDS/TMC traffic information or other data information.

What is claimed is:

1. A radio receiver comprising:
   a first tuner circuit for receiving radio signals of a first and a second frequency range; and
   a second tuner circuit for receiving radio signals of a third frequency range,
   wherein the second tuner circuit also receives radio signals of the first frequency range and works independently of the first tuner circuit, the second tuner circuit comprising:
   a first mixer circuit for converting the radio signals of the third frequency range to the second frequency range; and
   a first integrated circuit element for alternatively converting the radio signals of the first frequency range to a first intermediate frequency, or the radio signals of the third frequency range, converted to the second frequency range by the first mixer circuit, to a second intermediate frequency, wherein the second tuner circuit derives coded information in the form of traffic information from the radio signals of the first frequency range.

2. The radio receiver as claimed in claim 1, wherein the radio signals of the first frequency range are frequency-modulated FM band signals, the radio signals of the second frequency range are amplitude-modulated AM band signals, and the radio signals of the third frequency range are frequency-modulated US weather band signals.

3. A radio receiver as claimed in claim 1, wherein the second tuner circuit further comprises:
   a second integrated circuit element for alternatively converting the radio signals of the first frequency range, having been converted to the first intermediate frequency by the first integrated circuit element, to the second intermediate frequency, or the radio signals of the second frequency range, having been converted to the second intermediate frequency by the first integrated circuit element, to a third intermediate frequency.

4. The radio receiver as claimed in claim 1, wherein the first tuner circuit comprises:
   a third integrated circuit element for alternatively converting the radio signals of the first frequency range to the first intermediate frequency, or the radio signals of the second frequency range to the second intermediate frequency; and
   a fourth integrated circuit element for alternatively converting the radio signals of the first frequency range, having been converted to the first intermediate frequency by the third integrated circuit element, to the second intermediate frequency, or the radio signals of the second frequency range, having been converted to the second intermediate frequency by the third integrated circuit element, to the third intermediate frequency, wherein the first and third integrated circuit elements as well as the second and fourth integrated circuit elements have identical structures.

5. The radio receiver as claimed in claim 1, wherein the first integrated circuit element comprises:

an oscillator circuit having an oscillator frequency which is an integer multiple of a predefinable reference frequency, the oscillator circuit being coupled to the first mixer circuit;

a divider coupled to an output of said oscillator circuit; and an internal mixer circuit coupled to an output of said divider, said internal mixer circuit mixing the radio signals of the second frequency range to the second intermediate frequency.

6. The radio receiver as claimed in claim 1, wherein the first intermediate frequency is 72.2 MHz and the second intermediate frequency is 10.7 MHz.

7. The radio receiver as claimed in claim 1, wherein the second tuner circuit comprises an RDS/TMC data decoder.

8. An audio apparatus comprising a circuit arrangement as claimed in claim 1.

9. A car radio comprising a circuit arrangement as claimed in claim 1.

* * * * *